US006960764B2

(12) United States Patent
Dirksen et al.

(10) Patent No.: US 6,960,764 B2
(45) Date of Patent: Nov. 1, 2005

(54) METHOD OF MEASURING THE PERFORMANCE OF A SCANNING ELECTRON MICROSCOPE

(75) Inventors: Peter Dirksen, Leuven (BE); Rene Johan Gerrit Elfrink, Eindhoven (NL); Casparus Anthonius Henricus Juffermans, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 71 days.

(21) Appl. No.: 10/482,200

(22) PCT Filed: Jul. 19, 2002

(86) PCT No.: PCT/IB02/03025

§ 371 (c)(1),
(2), (4) Date: Dec. 22, 2003

(87) PCT Pub. No.: WO03/010792

PCT Pub. Date: Feb. 6, 2003

(65) Prior Publication Data

US 2004/0173748 A1 Sep. 9, 2004

(30) Foreign Application Priority Data

Jul. 26, 2001 (EP) .................................. 01202856

(51) Int. Cl.⁷ .......................... G01N 23/00; G21K 7/00
(52) U.S. Cl. ..................................... 250/307; 250/311
(58) Field of Search ................................ 250/307, 311

(56) References Cited

U.S. PATENT DOCUMENTS

| | | | | |
|---|---|---|---|---|
| 5,887,080 A | * | 3/1999 | Tsubusaki et al. | 382/172 |
| 6,103,009 A | * | 8/2000 | Atoji | 117/97 |
| 6,333,510 B1 | * | 12/2001 | Watanabe et al. | 250/559.27 |
| 6,657,431 B2 | * | 12/2003 | Xiao | 324/244 |
| 6,825,480 B1 | * | 11/2004 | Watanabe et al. | 250/491.1 |
| 6,827,979 B2 | * | 12/2004 | Mirkin et al. | 427/256 |
| 2002/0019729 A1 | * | 2/2002 | Chang et al. | 703/6 |
| 2002/0035461 A1 | * | 3/2002 | Chang et al. | 703/13 |
| 2002/0063212 A1 | * | 5/2002 | Mirkin et al. | 250/306 |

* cited by examiner

*Primary Examiner*—John R. Lee
*Assistant Examiner*—Paul M. Gurzo
(74) *Attorney, Agent, or Firm*—Peter Zawilski

(57) ABSTRACT

The performance of a scanning electron microscope (SEM) (10) is determined by scanning, with this SEM, porous silicon surface areas ($PS_F$, $PS_C$) each having a different average pore size, calculating the Fourier transform spectra ($F_c$) of the images of the surface areas and extrapolating the resolution (R) at a zero signal-to-noise ratio (SNR) from the width (W(1/e)), the signal amplitude (Sa) and the noise offset (NL) of the spectra. A test sample provided with the different surface areas is obtained by anodizing a silicon substrate (Su) at a constant electric current, while continuously decreasing the substrate area exposed to the etching electrolyte (El).

4 Claims, 6 Drawing Sheets

METHOD OF MEASURING THE PERFORMANCE OF A SCANNING ELECTRON MICROSCOPE

The invention relates to a method of determining the imaging quality of a scanning electron microscope used for measuring sizes of device features configured in a substrate layer during manufacture of devices, the method comprising the steps of:
provproviding porous silicon surface areas;
scanning the surface areas by means of the scanning electron microscope;
analyzing the images taken by the scanning electron microscope by means of a Fast Fourier Transform technique to obtain an indication of the resolution of the scanning electron microscope.

The invention also relates to a test substrate for use with the method, a method of manufacturing the test substrate, a process of mass-manufacturing devices wherein the method of determining is used, and a self-testing scanning electron microscope.

For the manufacture of said devices, use is made of lithographic methods, which comprise a larger number of masking, etching, implantation and other steps. A lithographic projection apparatus is an essential tool in the lithographic techniques. By means of such an apparatus, for each device layer to be configured, a mask pattern comprising pattern features corresponding to the device features to be configured in said layer is transferred to a radiation-sensitive film coated on said layer before the imaging step is performed. The radiation-sensitive layer is specifically sensitive to the radiation used for imaging, i.e. changes its properties in areas where the radiation is incident. Such a layer is an embodiment of a resist layer, which term also covers a layer which is sensitive to a charged particles beam, for example an electron beam. Transferring a pattern is understood to mean both imaging a mask pattern in a resist layer and writing a pattern in such a layer, for example by means of an electron beam. During the device manufacturing process, consecutive mask patterns, each one for another substrate layer, are transferred to the same target, for example an IC area, on the substrate.

The lithographic method and apparatus may also be used in the manufacture of devices other than ICs like, for example, integrated or planar optical devices, magnetic heads or liquid crystalline display panels.

A substrate is understood to mean a plate of material, for example silicon, into which a complete multilevel device, such as an IC, is to be formed level by level by means of a number of successive sets of processing steps. Each of these sets comprises as main processing steps: coating a radiation-sensitive, or resist, film on the substrate, aligning the substrate with a mask, imaging the mask pattern in the resist film, developing the resist film, etching the substrate via the resist film and further cleaning and other processing steps. The term substrate covers substrates at different stages in the manufacturing process, i.e. both a substrate having no or only one level of already configured device features and a substrate having all but one level of already configured device features, and all intermediate substrates.

The settings, for example the focus, and the performance of the projection apparatus are controlled at regular points of time, for example at the beginning of a workday or at the start of exposing a batch of identical substrates. A test mask or a production mask, used for exposing of the batch of wafers, is imaged at different positions and possibly with different focus settings in the resist layer on a test substrate. After the resist has been developed, the surface of the test substrate is scanned by an electron microscope (SEM) to determine the quality of the pattern configured in the resist layer. Usually, the quality of the smallest feature dimensions, also called critical dimensions (CD) is determined. In this way the best focus setting can be determined and whether the required image quality is obtained. The data obtained from the test exposure performance can be used to correct settings of the projection apparatus.

It is desirable to steadily decrease the width of the device features configured in a substrate in order to steadily increase the operating speed of a device and/or to increase the number of electronic components in an IC device. As a consequence, mask patterns with increasingly smaller pattern features and smaller distances between these features should be imaged. This means that increasingly stricter requirements have to be imposed on the CD control in the device production environment and to reduce or eliminate error sources that may affect this control. An important error source is the instability of the widely used metrology tool, the SEM.

Conventionally, a CD-SEM is stabilized and calibrated by using a standard test sample, i.e. a calibration wafer provided with a specific mask pattern of features and inter-spaces and the feature width and periodicity are monitored by the SEM. If the measured feature width and period are different from the standard values, the SEM has to be adjusted until the measured values correspond to the standard values. A problem inherent in this way of calibration is that the line width measurement algorithm used for analyzing the SEM output data is not suitable for detecting small focus errors or stigmatic errors so that such errors may remain unnoticed. This may result in bad device layers passing the SEM test, which will go on until it is noticed that the yield of the device production process has dropped. Meanwhile, a lot of devices have been wasted. Moreover, this way of calibration is strongly coupled to a specific test sample. If a test sample needs to be replaced by a new test sample, for example because the first sample is broken or contaminated, the new test sample needs to be measured first in order to characterize it and to relate the results of the measurements made with the new and the first test sample, respectively, with each other.

As pointed out by G. L. Fanget et al. in the paper: Survey of Scanning Electron Microscopes Using Quantitative Resolution Evaluation" in SPIE Vol.3050, 1997, pages 80–92, the resolution of a SEM provides a good image of the ability of the SEM to perform CD measurements or process evaluations. The resolution is determined by scanning a special sample by the SEM, and the image data taken in by the SEM is processed with frequency domain transforms. This allows a more objective determination of the resolution than a human eye check, which is tricky and subjective. The sample used is a silicon layer with a microporous surface with a random distribution of the diameter and location of the pores. Deep pores with diameters ranging from 5 to 50 nm, almost perpendicular to the surface and with thin walls, lead to high contrast images. The sample is obtained by etching a silicon wafer in a hydrofluoric acid electrolyte. After scanning of the sample, a two-dimensional Fast Fourier Transform (2D FFT) image analysis process is carried out, which results in a noisy spectrum having small peaks located randomly in the frequency domain (FD). To improve the measurement, the spectrum is smoothed by a convolution with what is termed a two dimensions door function. This provides the same result as determining a moving average of the pixels in each direction of the frequency domain. Then a large number, for example, sixty directions of the frequency domain are checked and a cut-off frequency (COF) is determined on each of them. The values of these COFs are depicted in a Resolution Contour Map.

In this resolution measuring method, the same sample structure is measured a number of times and the values measured are influenced by the sample structure. The method is thus sample structure-dependent and requires calibration. This is acknowledged in a second paper: "A contribution to the evaluation of scanning electron microscope resolution" in: SPIE Vol. 3332, 1998, pages 71–80. According to this paper, the image processing is designed to extract the transfer function of the SEM from the sample image and to analyze this function. This would lessen the influence of the sample parameters on the final results and provide more precise information about the SEM itself than a sample description. Also in the second method, the same sample structure is measured a number of times.

It is an object of the present invention to provide a fast method of determining the imaging quality of a SEM as defined in the opening paragraph, wherein the measured resolution is independent of the surface structure. This method is characterized in that the step of scanning the surface areas and the step of obtaining the resolution, respectively, comprise:

taking images of a number of surface structures having different average pore sizes;

calculating the Fourier spectrum of each of these images, and determining the resolution of the scanning electron microscope by extrapolating the resolution belonging to a signal-to-noise ratio of zero from the width, the signal amplitude and the noise offset of the Fourier spectrum of all of said images.

The invention is based on the insight that, by taking images of a sufficient number of surface areas having sufficiently different average pore sizes, which images each have a specific Fourier spectrum, sufficient image data can be obtained to extrapolate from these the value of the spectrum width for a signal-to-noise ratio of zero. The latter value corresponds to the resolution of the SEM. In this way, the obtained resolution is independent of the test sample used.

A first embodiment of the method is characterized in that the step of taking images comprises scanning of porous silicon surface areas of a number of separate substrates, each of which has a different average pore size.

An inventive and preferred embodiment of the method is characterized in that the step of taking images comprises scanning of a single substrate provided with a porous silicon surface having an average pore size which increases continuously in one direction from a small size to a larger size.

This inventive embodiment is based on the insight that the porous structures with different average pore sizes can be provided on a single test substrate so that the resolution of the SEM can be determined by scanning only this single substrate, which yields substantial time saving.

In order to allow initial focusing on the test sample and/or navigation and pattern recognition, the second embodiment is preferably further characterized in that use is made of a substrate, the porous surface of which is provided with an additional pattern of features having dimensions which are substantially larger than the pore sizes.

The dimensions of the features of the additional pattern are in the range of $\mu$ms which allows an initial focusing and an ultimate, for example stepwise, focusing of the SEM on the porous structure. Each additional pattern may comprise information about the position of the associated substrate surface area, which allows positioning of any given area in the object field of the SEM.

The invention also relates to a new and inventive test substrate for use in the new method. This substrate is characterized by a porous silicon surface having an average pore size which increases continuously in one direction from a small size to a larger size.

The advantage of this substrate is that it allows a considerable reduction of the time needed for determining the resolution of the SEM, which is of great importance in a device production environment wherein the SEM is used.

A preferred embodiment of this test substrate is characterized in that the porous surface is provided with an additional pattern of features having dimensions which are substantially larger than the pore sizes.

This test substrate allows an initial focusing of the SEM on the sample and/or navigation and pattern recognition.

Preferably, this test substrate is characterized in that the additional pattern comprises elongated features having their length direction in the direction of the increasing average pore size.

The test substrate may be further characterized in that the additional pattern is constituted by a patterned layer of a non-silicon material.

The features of this pattern show sufficient contrast with respect to their surroundings.

An embodiment of this test substrate is characterized in that the patterned layer comprises one of the metals tungsten, titanium, zirconium, hafnium, cobalt, yttrium, lanthanum, platinum, palladium and aluminum.

These materials, which are used for other purposes in lithographic techniques, are well resistant to HF etching.

An alternative embodiment of the test substrate is characterized in that the patterned layer comprises one of the materials zirconium nitride, silicon nitride and silicon carbide.

Especially a nitride composition with a large amount of silicon is very suitable for this layer.

The invention further relates to a method of manufacturing a test substrate with a porous silicon, the average pore size of which increases continuously in one direction from a small size to a larger size. This method is characterized by the successive steps of:

arranging a $P^+$ doped silicon substrate in a cell filled with a salt solution;

immersing the cell in a container filled with an electrolyte solution, connecting one of the poles of a current source to a cathode arranged in the container and the other pole to the cell, which forms an anode such that an electric current flows from the substrate to the anode;

continuously reducing, in one direction, the substrate surface area exposed to the electrolyte solution, and switching off the electric current when the substrate surface gets free from the electrolyte solution.

This is a simple and fast method of obtaining the composed porous structure needed to carry out the method described above, which method can be carried out with simple means.

This method may be further characterized by the additional steps of forming an additional pattern of features having dimensions which are substantially larger than the pore sizes.

The additional pattern may be formed first and then the pores are etched. For the patterned layer, one of the above-mentioned metals is very suitable because they have a good HF etching resistance.

Preferably, the manufacturing method is characterized in that the additional pattern is formed after the substrate surface has been provided with a porous structure.

The use of the method and apparatus for determining the imaging quality of a SEM in the environment of a process of manufacturing devices, such as ICs, allows the yield of this process to be improved. The invention therefore also relates to a process of mass-manufacturing devices comprising device features in at least one substrate layer of device substrates, which process comprises at least one set of the following successive steps:

providing a mask pattern comprising features corresponding to device features to be configured in said layer;
imaging the mask pattern in a resist layer coated on the substrates and developing this layer, thereby forming a patterned coating corresponding to the mask pattern;
removing material from or adding material to areas of the substrate layer, which areas are delineated by the pattern of the patterned coating;
while, at the start of manufacturing of a batch, a substrate provided with a patterned coating is controlled by taking images of it by means of a scanning electron microscope and analyzing the images to control the dimensions of the patterned coating features. This process is characterized in that the imaging quality of the electron microscope is regularly checked by means of the method as described herein before.

The invention may also be implemented in a scanning electron microscope comprising a scanning electron unit, an object holder for holding an object to be examined by the microscope and a signal-processing unit provided with a program to analyze data supplied by the scanning unit. This microscope is characterized in that a small portion of the object holder surface facing the scanning device is permanently provided with a test sample in the form of a small porous silicon surface, the average pore size of which increases continuously in the scanning direction of the scanning unit, and in that the processing unit is provided with an additional program to analyze the data supplied by the scanning unit during scanning of the test sample.

By positioning the object holder in such a way that the test sample is in the object field, while scanning the sample and processing the data supplied by the scanning unit, the instantaneous performance of the microscope can be determined. In this way, a self-checking electron microscope is obtained.

These and other aspects of the invention are apparent from and will be elucidated by way of non-limitative example with reference to the embodiments described hereinafter.

Figure 1:
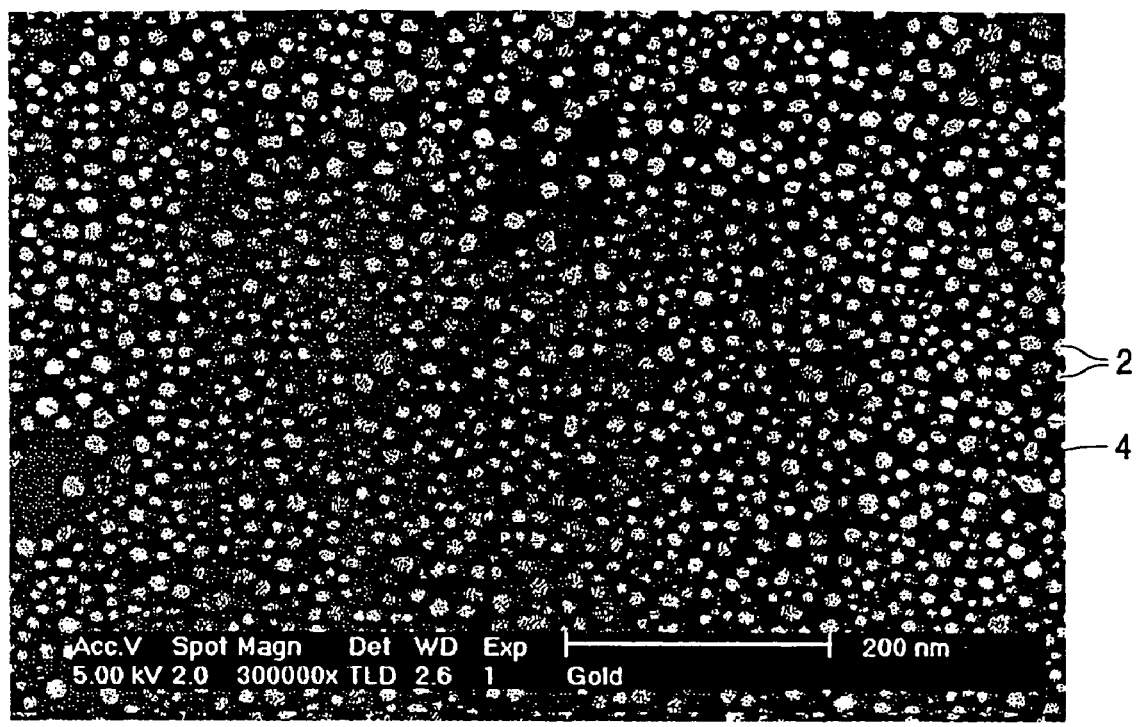
FIG. 1 shows the surface of a conventional test substrate.

The main parameter for the quality of a SEM is its resolution. Usually, determining the resolution is a subjective procedure. Typically, the SEM to be examined scans a carbon sample provided with gold particles as shown in FIG. 1. In this Figure, the, light, gold particles are denoted by the reference numeral 2 and the, black, carbon background is denoted by the reference numeral 4. An operator examines the image provided by the SEM to determine the smallest particle and/or the smallest spacing between particles that are still visible. The minimum spacing is called the resolution. Determining the resolution in this way is a subjective process and requires skill of the operator. The chance of a false determination is increased by the fact that a single image is usually examined so that no measures are taken to eliminate or reduce noise effects.

The imaging quality of the SEM, thus the quality of a micrograph, like that shown in FIG. 1, can be evaluated more easily in the frequency, i.e. the Fourier, domain. Computer programs for such an evaluation are already available. Such a program reduces the subjectivity of the evaluation and provides a quantitative framework for monitoring resolution, astigmatism, image quality over time and for comparing the performance of different SEMs. The measurement data can also be used to adjust a SEM to obtain an optimum performance.

Figure 2:
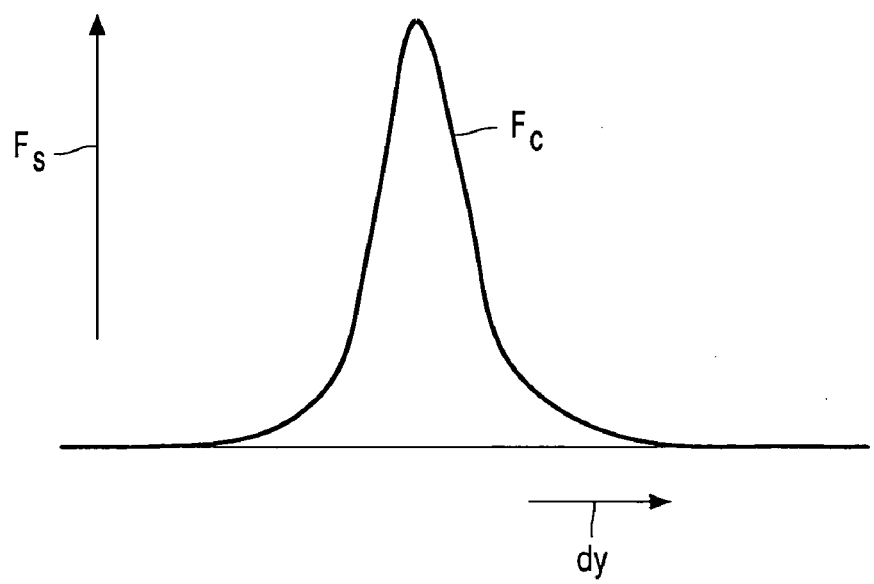
FIG. 2 shows the Fourier spectrum of such a surface.

In analyzing the SEM data by means of the well-known Fast Fourier Transform technique, a spectrum in the frequency domain is obtained. This spectrum is well described by a Gaussian shape. FIG. 2 shows an example of such a Fourier spectrum. The Fast Fourier Transform (FFT) values $F_s$ as a function of the density of the particles on the scanned sample are represented by the Gaussian curve Fc, which fits best with the calculated values. The density $d_y$ of the particles on the sample along the Y-axis of an XY co-ordinate system is plotted along the horizontal line of FIG. 2. The Fourier spectrum is not only determined by the resolution of the SEM, but also by the structure of the sample so that the resolution measurement is influenced by the sample structure.

It has turned out that a silicon substrate with a microporous surface structure is an attractive sample for high-resolution measurements. Very fine details of the porous structure can be observed if the SEM is set at high resolution. The microporous structure can be obtained by anodic dissolution of a silicon substrate in a concentrated hydrofluoric (HF) acid, as will be described hereinafter. The pores of the structure are perpendicular to the surface and have sharp walls so that a high contrast is obtained.

When scanning such a porous silicon structure with a SEM and analyzing the images, a Fourier spectrum like that of FIG. 2 is obtained. The curve of this spectrum is similar to a theoretical curve shown in the above-mentioned paper: "A contribution to the evaluation of scanning electron microscope resolution". The Fourier spectrum comprises information about the resolution of the SEM used to scan the porous structure so that the resolution could in principle be derived from this spectrum. However, the Fourier values obtained according to said papers are again not only dependent on the resolution of the SEM, but also on the structure of the porous substrate. The measured resolution comprises a substrate structure-dependent term, which means that a calibration process has to be carried out. Moreover, also noise effects influence the measured resolution.

To obtain a porous silicon surface structure whose pores have a given average size, a silicon wafer is anodized in a solution comprising a given percentage of HF under a given constant electric current density during a given time interval. By using different electric current densities and different concentrations of HF, porous structures with different average pore sizes are obtained. If the current density is increased and the HF concentration is decreased, the average pore size will increase. If the current density is decreased and the HF concentration is increased, the average pore size will decrease. When the silicon substrate is immersed in a HF solution, and an electric current is forced to flow from the substrate to a cathode arranged in the HF solution, dissolution of silicon takes place due to attack of $F^-$ ions and silicon fluoride atoms are formed, wherein electronic charges are involved. If the substrate is $P^+$ doped silicon, electric holes are transported from the bulk of the material to the surface. The formation of the surface pores is based on the diffusion-limited transport of holes from the silicon bulk to the pores being formed. Since the diffusion length depends on the electric current density and the doping level, the size of the pores and their distribution is a function of these two parameters.

Figure 3:
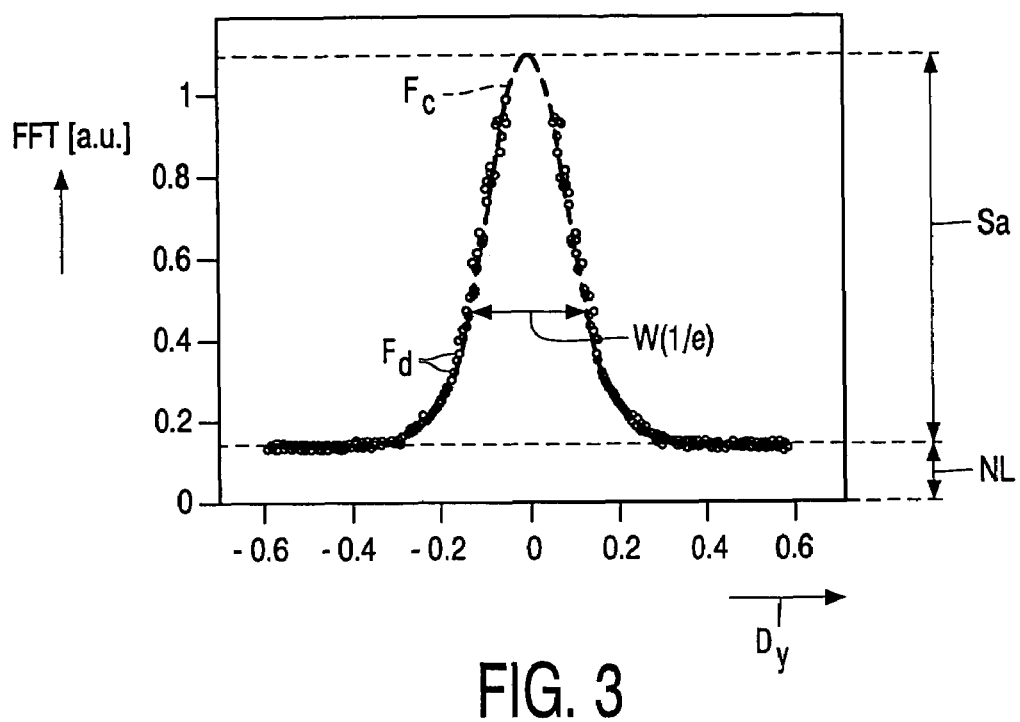
FIG. 3 shows a Fourier spectrum of an embodiment of a porous silicon surface used in the method of the invention.

The method of the invention makes advantageous use of the possibility to control the average pore size in the above, easy, way. According to the invention, a number of different porous structures is made, each by means of a different electric current density and a different HF concentration. The SEM to be measured scans each of these structures, and their Fourier spectra are calculated. Noise effects are also taken into consideration. A corresponding number of Fourier spectra are is obtained, one of which is shown in FIG. 3. This spectrum is the spectrum of a porous structure obtained by anodizing a silicon wafer in 10% BF under a constant electric current density of 7.5 mA/cm$^2$ for 5 minutes.

FIG. 3 shows a large number of discrete Fourier values $F_d$. The dotted curve $F_c$ is the Gaussian curve, which fits best with the discrete values $F_d$. The Fourier spectrum, or curve Fc has a signal amplitude Sa and shows a constant offset, which represents a substantially uniform background or constant noise level NL, which is independent of the sample. This noise level NL is related to the SEM and its physical cause may be thermal or shot noise of the detector of the SEM, which noise has a white noise spectrum, and/or mechanical vibrations of the sample holder.

An important parameter for the new method is the 1/e-width, denoted by W(1/e) in FIG. 3, of the curve $F_c$ i.e. the width of the Gaussian curve at a signal amplitude, which is 1/e of the maximum value Sa. The 1/e-width, the signal amplitude Sa and the noise level NL can be calculated from the image data by using a known least-squares fit routine, i.e. a method of fitting a curve to experimental data. The 1/e-width is used to determine the resolution of the SEM. This width is also dependent on the porous structure of the test substrate so that a SEM resolution measured by means of a single sample with a given structure would still comprise a substrate structure-dependent term. According to the invention, a number of porous silicon structures having different average pore sizes is scanned, data of their Fourier spectra are combined and a SEM resolution, which is independent of the porous structure, is determined by extrapolation from these data.

The different porous structures needed for this method can be provided in the form of such structures on different substrates, which are successively put in the object field of the SEM to be measured, scanned and removed from the object field. The time needed for measuring the different porous structures can be substantially reduced if these structures can be put on discrete surface areas of a single substrate. Then, by scanning one substrate, all necessary information is collected.

A substantial part of the invention resides in the method and apparatus for making such a substrate with different porous structures. The principle of this method and apparatus is shown in FIG. 4.

Figure 4:
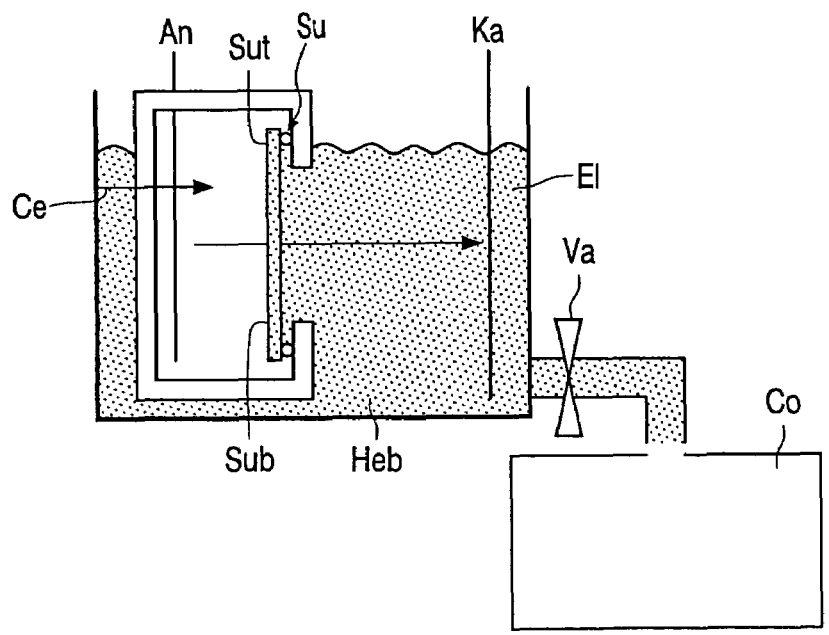
FIG. 4 shows an apparatus for producing a test silicon substrate according to the invention.

The etching apparatus of FIG. 4 comprises an etching bath holder $H_{Eb}$ filled with an electrolyte comprising hydrofluoric (HF) acid. A cathode Ka, for example made of platinum, is arranged in the holder $H_{Eb}$. In the holder $H_{Eb}$. A cell Ce for accommodating a substrate Su is immersed in the electrolyte El. The cell comprises an anode AN, for example made of platinum An, which is connected to a first pole of a current source Cs, the other pole of which is connected to the cathode Ka. During the etching process, the current source forces a constant current to flow from the anode to the cathode. The cell Ce is filled with a salt solution Sa, for example $K_2SO_4$ in a concentration of 22 g/l, which provides an electrical connection between the anode and the substrate Su. The substrate thus functions as an anode during the etching process. The substrate to be etched is a $P^+$ silicon wafer, which is heavily doped with boron and has a low electrical resistance of, for example 0.01–0.02 ohm.cm. The advantage of such a low resistance is that the wafer can be simply immersed in the cell and that no rearside contact of boron implantation and aluminum evaporation is needed. The electrolyte El preferably comprises ethanol, for example, 50%. The addition of ethanol to the HF solution guarantees that the result of the etching process is reproducible. As a further improvement, a small amount of Triton-X, for example in a concentration of 10 ml/61, may be added to the solution in order to lower the surface tension.

At the beginning of the etching process, the substrate Su is fully immersed in the electrolyte and the electric current is distributed on the entire substrate surface so that the current density is relativly low. Then the substrate surface area that is in contact with the electrolyte is continuously decreased. As the current is constant, the current density will continuously increase, which results in a continuous increase of the average size of the pores being formed. This size will be the largest at the surface areas that are in contact with the electrolyte for the longest time. In this way, a porous silicon surface is formed, having an average pore size gradient. The amount of HF in the etching bath may be of the order of 10% and the current density may range from a few to some tens of mA/cm$^2$.

To decrease the substrate surface area that is in contact with the electrolyte, the substrate can be pulled out of the electrolyte, i.e. in the apparatus of FIG. 4, the substrate is moved slowly upwards. Preferably, the level of the electrolyte is decreased continuously, simply by opening a valve Va in the etching bath holder $H_{Eb}$.

The electrolyte leaving the valve is collected in a container Co and may be cleaned and re-used in a subsequent etching process.

Figure 5:
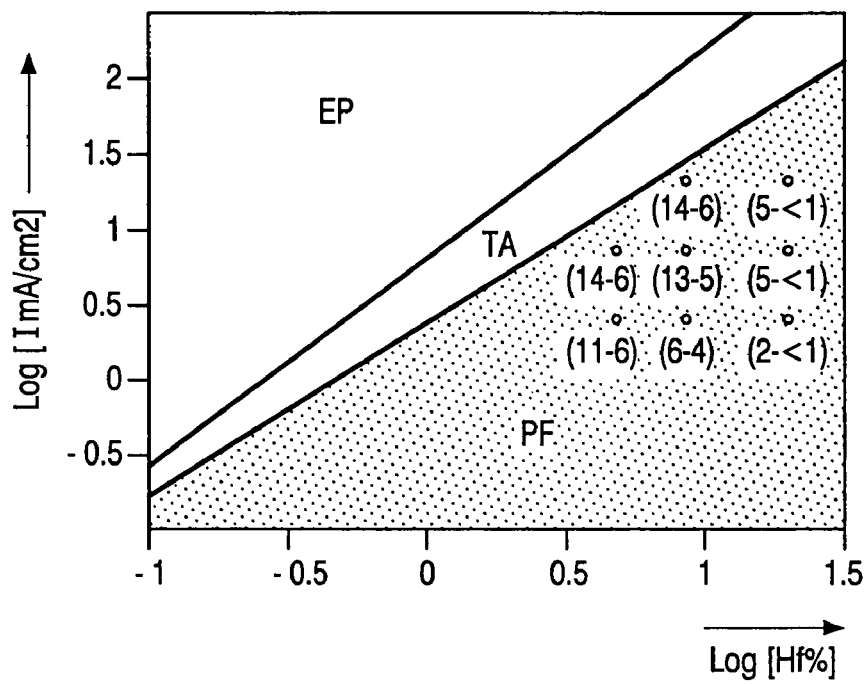
FIG. 5 shows the variation of the pore sizes of the test substrate as a function of the HF concentration and the current density.

FIG. 5 shows the variation of the pore radius as a function of the concentration HF ($^{10}$Log(HF along the horizontal axis) and the electric (anodization) current I (10 Log(I) along the vertical axis). FIG. 5 demonstrates that pore formation is favored at higher HF concentrations and lower current densities, i.e. the area PF in the Fig. At lower HF concentrations and higher current densities, i.e. the area EP in FIG. 5, the surface will be electro-polished. There is a transition area TA between the areas PF and EP. The dots in the PF area represent settings used in experiments and the numbers at these dots indicate the typical pore sizes in nm, which are formed when using these settings. For example, with a 10% HF concentration and a 7.5 mA/cm2 current density, pores with a radius in the range of 13 to 5 nm are formed. FIG. 5 corroborates the fact that the pore size can be tuned by varying the HF concentration and the current density. As a rule of thumb, a larger current density results in larger pores and a broader range of pore sizes, and a higher HF concentration results in smaller pores and a smaller range of pore sizes.

The porous structure obtained by means of the method and apparatus illustrated in FIG. 4 shows a gradient in the average pore size in one direction, namely the direction in which the surface area that is in contact with the electrolyte is reduced. The average pore size at the upper side $Su_t$ of the substrate is smallest and that at the lower side $Su_b$ is largest. The etching conditions can be set in such a way that the average pore size ranges from very fine, of the order of 1 nm to relatively coarse, of the order of 25 nm. The substrate, which is provided with the porous structure, may be a current 8-inch silicon wafer.

Figure 6A:
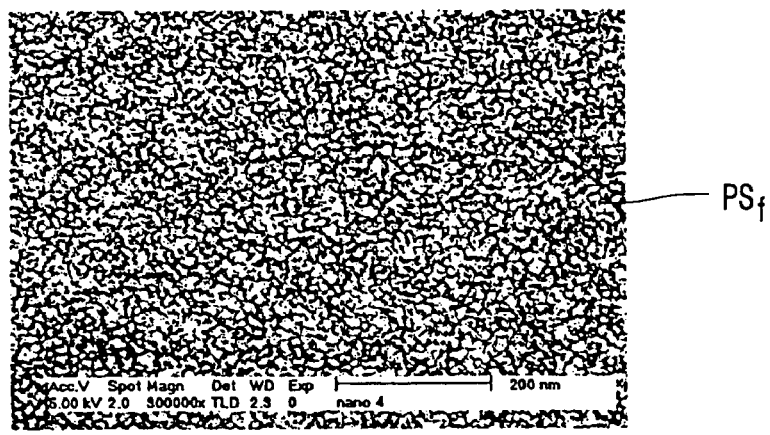
FIGS. 6a and 6b show two portions of the porous surface obtained by the test substrate producing method of the invention.
Figure 6B:
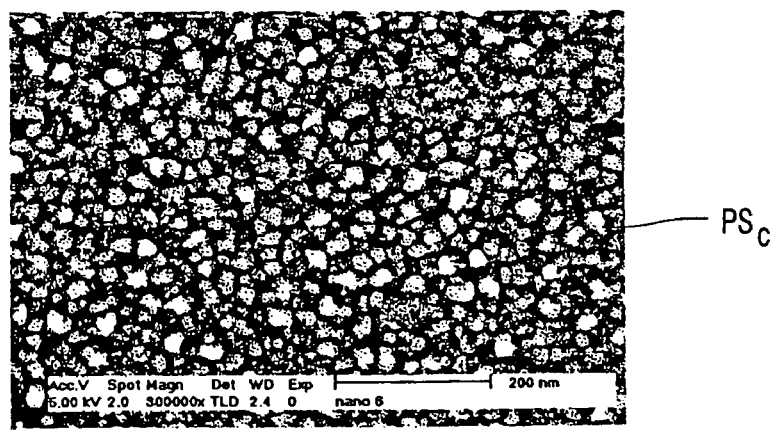

FIG. 6a shows, by way of illustration, a portion of the substrate upper side fine porous structure $PS_F$ and FIG. 6b shows a portion of the substrate lower side coarser structure $PS_C$. Both pictures have been taken with a SEM set at a magnification of 300.000×.

Figure 7:
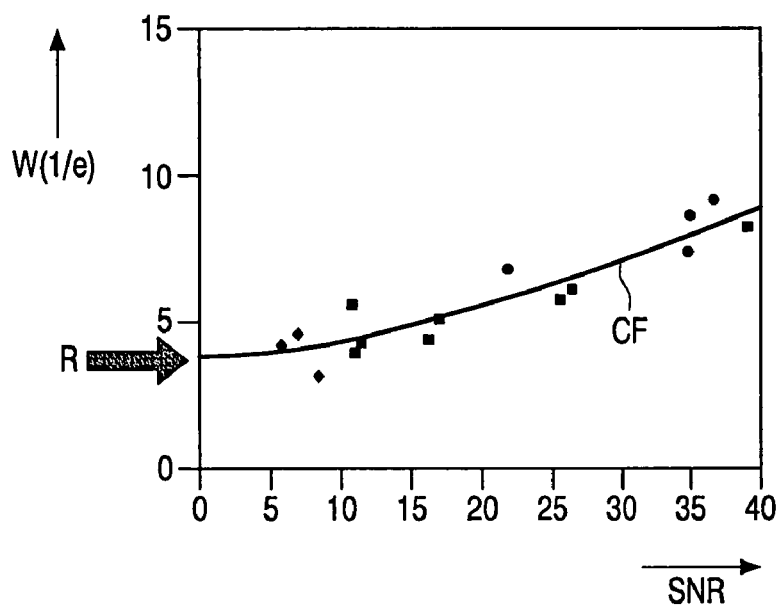
FIG. 7 shows values of 1/e-widths and signal-to-noise ratios of Fourier spectra obtained when scanning this surface and a best-fit curve for these values.

According to the invention, the resolution of a SEM is determined by arranging the porous silicon surface with the gradient in average pore size in the object field of the SEM and scanning it in the direction of the gradient. The SEM takes images of successive surface area portions, which images are analyzed. Each image is transformed in a Fourier spectrum like that of FIG. 3. The 1/e width (W(1/e)) and the signal to noise ratio (SNR) of each spectrum are determined. FIG. 7 shows the values of these parameters for all of the images as well as a, theoretical, curve CF which fit best with these values.

This method has the following physical background. For porous structures having relatively large pores, $PS_C$ at the lower side of the substrate, the number of pores per length unit, expressed in lines/nm Dy in FIG. 3, is relatively small. The pore diameter is well within the resolution limit of the SEM so that the 1/e-width of the Fourier spectrum is determined by the porous structure. The spectrum of such a relatively coarse structure shows relatively high spectral intensities. For porous structures having relatively small pores, $PS_F$ at the upper side of the substrate, the number of pores per unit length is relatively large and the 1/e-width is relatively large and approaches the resolution of the SEM. It is impossible to resolve porous structures, whose spatial frequencies are beyond the resolution of the SEM. The spectral intensities of a fine porous structure are relatively small. FIG. 3 also shows a frequency-independent noise contribution, or noise level NL. This noise level is related to the SEM itself and is caused, for example, by the shot noise of the SEM detector or by mechanical vibrations of the substrate holder. The noise level is constant and independent of the porous structure. As a finer porous structure provides smaller spectral intensities, its Fourier spectrum shows a smaller signal-to-noise ratio SNR than a coarser porous structure. Within the limit of a very fine porous structure, the SNR approaches zero and the 1/e-width of the spectrum approaches the resolution of the SEM. This limit can be found supplying the SEM with a number of porous silicon samples with average pore sizes in the range of, for example, 1 to 25 nm, determining the values of W(1/e) and SNR for each sample, fitting as curve CF with these values and determining the point of intersection of the curve CF. This point R, indicated by the solid-line arrow in FIG. 7, represents the resolution of the SEM being examined.

The method described above with respect to a single sample having a gradient in average pore size in one direction, can also be used in combination with a number of samples each having a given average pore size which is different from that of the other samples. The separate samples can be obtained by anodizing a corresponding number of silicon substrates in a HF solution, each time with another current density and/or another HF concentration. Use can be made of the apparatus of FIG. 4. During etching of a substrate, the valve Va remains closed.

Figure 9:
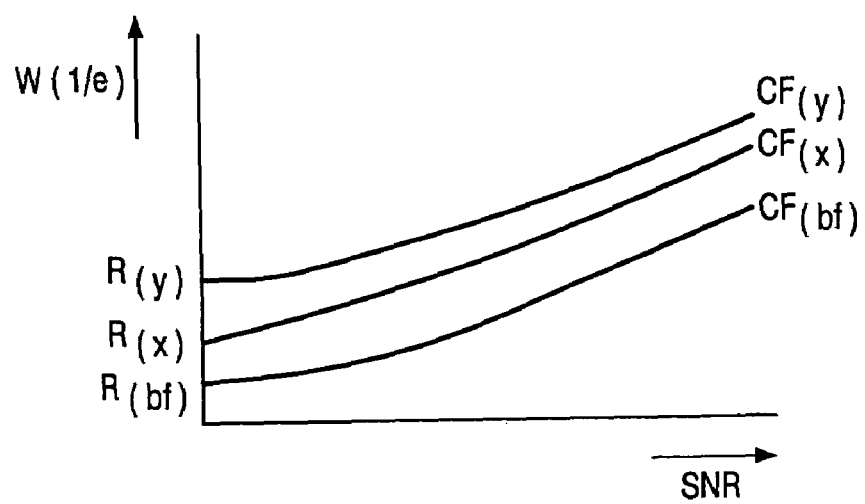
FIG. 9 shows best-fit curves resulting from measurements in different directions and for the best focus condition.

The graph CF of FIG. 7 is the best-fit curve for 1/e-widths in one direction, for example the X direction of an orthogonal system of coordinates, from which curve the resolution of a SEM in that direction can be determined. A second test sample with a gradient of average pore size in the Y direction may be prepared and scanned by the SEM. A best-fit curve for 1/e-widhts in the Y direction is then obtained. This is illustrated in FIG. 9 wherein an arbitrary best-fit curve for the X direction is denoted by CF(x) and a best-fit curve for the Y direction is denoted by CF(y). The 1/e width at a signal-to-noise ratio (SNR) which is equal to zero, corresponding to the resolution of the SEM, in the X and Y-directions is denoted by R(x) and R(y), respectively. If, as illustrated in FIG. 9, the resolution in the X direction is different from that in the Y direction, the measured SEM shows astigmatism. By augmenting the method of the invention to measurements in two, preferably mutually orthogonal directions, the astigmatism of a SEM can be measured. This astigmatism is proportional to R(y)–R(x). The result of this measurement can be used to control the stigmatizer of the SEM so that the astigmatism of the SEM can be eliminated or reduced to an acceptable level.

Another parameter, which is important for the performance of a SEM, is the focus. The measurement according to the invention can be carried out every time for a different focus setting, which is called scanning through focus. The detector signals resulting from such an augmented measurement can be processed to Fourier Transform terms and a best-fit curve for the best focus values can be determined. Such a curve is denoted by CF(bf) in FIG. 9. The resolution R(bf) belonging to this curve is the real, or optimum, resolution of the SEM, i.e. the resolution for optimum focus and without astigmatism.

The method and apparatus described above may be used to determine the quality of a SEM, for example at the final stage of its production or during an acceptance test by the user of the SEM. The method and apparatus may also be used in an IC-production environment where SEMs are used to measure critical dimensions (CD) during the manufacture of ICs. Such a measurement is carried out, for example, after a resist layer has been exposed with a mask pattern and the resist developed and before the resist pattern is transferred to an appropriate layer of the IC substrate. By checking the SEM used for these measurements at regular time intervals, it is ensured that the results of the measurements are reliable. A decrease of quality of the ICs being manufactured can be observed and the manufacturing process can be corrected at an early stage so that the yield of manufacture can be maintained at a high level. In view of the large quantities of ICs being produced, this is of utmost importance in the IC production. In an IC production environment, a number of SEMs may be used for performing measurements at different stages in the production process of ICs, i.e. for different layers of the IC substrate. For IC layers with finer structures, i.e. smaller CDs, more accurate measurements and thus SEMs with a higher resolution are needed than for IC layers with coarser structures. The present method and apparatus can also be used to rank the SEMs in accordance with their resolution so that these SEMs can be used in an optimum manner.

The SEM to be examined can observe the porous structure with pore sizes of the order of nm only if it is set at a high magnification, for example the images shown in FIGS. 6a and 6b have been taken at a magnification of 300.000×. It is quite difficult to focus a SEM set at such a high magnification on a structure having feature dimensions of the order of nm. It is also difficult to ascertain which portion of the porous structure is scanned momentarily or to navigate the SEM at a required portion of the structure. According to another aspect of the invention, means are provided which allow the required focusing and navigation. These means are constituted by an additional pattern of features on the sample or substrate, which features have dimensions which are substantially larger than the pore sizes, in combination with a lower magnification of the SEM.

Figure 8A:
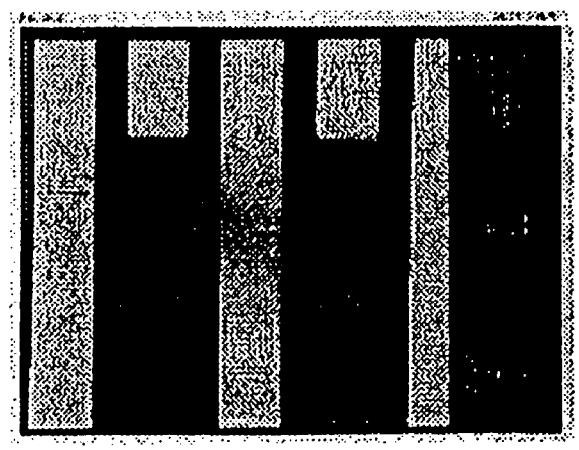
FIGS. 8a and 8b show images at different magnifications, respectively, of portions of a porous surface provided with an additional pattern.
Figure 8B:
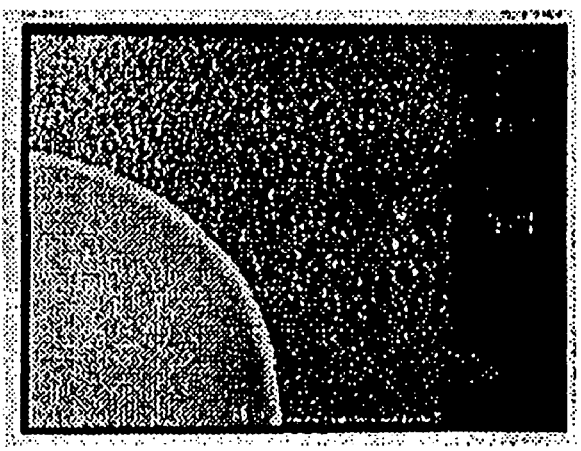

FIG. 8a shows an image of a small portion of a porous silicon substrate provided with an additional, or focus and navigation pattern, comprising a structure of features, for example bars of different lengths and widths. The longitudinal direction of the additional features is preferably the direction in which the gradient of the average pore size occurs. The dimensions of the additional features are of the order of um. In the additional structure, a position on the substrate may be encoded. The image of FIG. 8a is taken at a magnification of 1000×. At such a magnification of the SEM, the pores are invisible. FIG. 8b shows an image of a small sub-portion, at the location of an edge of one the bars of FIG. 8a, taken with a SEM magnification of 100.000× In this image individual pores are visible. When starting the examination of the test substrate, the magnification of the SEM is set at a low level and the SEM is focused at one of the additional pattern structures. Then the substrate area which is focused on is read and, if necessary, the substrate is moved to position another substrate area in the field of the SEM. The magnification of the SEM is increased until the pores become visible. The magnification may be increased stepwise, while different dimensions of the additional pattern structure may be used.

The additional pattern structure may be a patterned layer which is formed by means of a conventional lithographic process, which uses, for example an optical lithographic projection apparatus also known as wafer stepper/scanner. The material of the layer may be any one of the materials which are allowed to be used in the "front end litho" technique, which is the most critical part of a lithographic process and is very sensitive to contamination. The material should be resistant to HF etching and may be a metal, for example wolfram (W), titanium (Ti), zirconium (Zr), hafnium (Hf), Cobalt (CO), yttrium (Y), lanthanum (La), platinum (Pa), palladium (Pa) and aluminum (Al). The material of the patterned layer may also be of a non-metallic material, for example compositions with nitrogen, like zirconium nitride (ZrN), silicon nitride (SiN) and silicon carbide (SiC). Preference is given to aluminum, tungsten and nitride compositions, like silicon nitride ($Si_3N_4$) and silicon rich nitrides in general. A porous silicon substrate with the navigation and focus pattern may be produced by first providing the substrate with the pattern and then etching the substrate in a HF solution. However, preference is given to first etching the substrate and providing the porous surface of the substrate with the patterned layer. Etching of the additional pattern is then avoided, which allows a broader choice of materials for the patterned layer.

A SEM is used in the semiconductor industry as an element to control the quality of the lithographic process and apparatus therefor to image a mask pattern onto a substrate, or wafer, provided with a resist layer. The image formed in the resist layer delineates the surface areas of the substrate where changes in material have to be carried out. A process of mass manufacturing devices comprises device features in at least one substrate layer of device substrates, which process comprises at least one set of the following successive steps:

providing a mask pattern comprising features corresponding to device features to be configured in said layer;

imaging the mask pattern in a resist layer coated on the substrates and developing this layer, thereby forming a patterned layer corresponding to the mask pattern;

removing material from or adding material to areas of the substrate layer, which areas are delineated by the pattern of the patterned coating;

while, at the start of manufacturing of a batch, a substrate provided with a patterned coating is controlled by taking images of it by means of a scanning electron microscope and analyzing the images to control the dimensions of the patterned coating features.

When the imaging quality of the electron microscope is regularly checked by the method as described above, it is ensured that the control is reliable. This allows deviation or errors occurring in the lithographic process of manufacturing devices, such as ICs to be detected at an early stage so that corrective measures can be taken and to maintain the yield of the process is maintained at a high level. The invention thus has an effect on the process of mass manufacturing devices so that such a process is to be regarded as an implementation of the invention.

Figure 10:
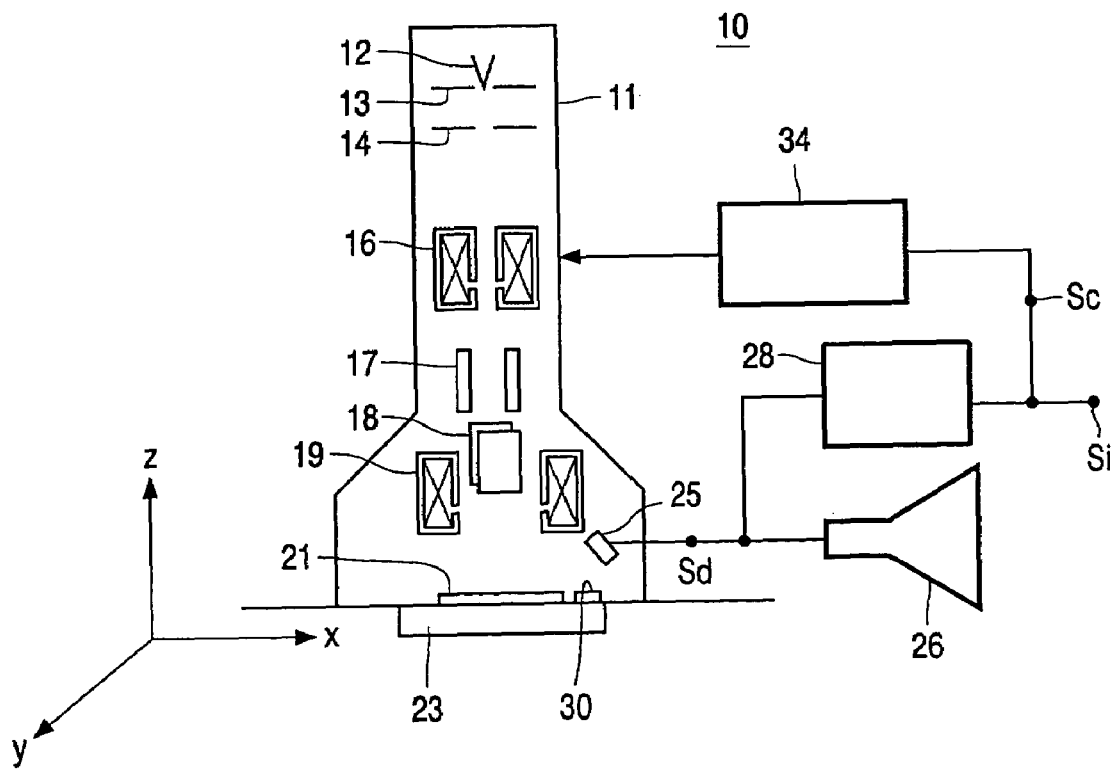
FIG. 10 shows a first embodiment of a SEM wherein the invention is implemented.

Another aspect of the invention relates to a scanning electron microscope provided with self-checking facilities. Such a SEM may not only be used for inspection in a lithographic process, but also for measurement and inspection in general. FIG. 10 schematically shows an embodiment of a SEM. The SEM 10 comprises an evacuated enclosure 11, which accommodates an electron gun 12, a control electrode 13, by which an electron beam is formed and accelerated, and an anode 14. The electron beam (not shown) from the gun consecutively passes through a first electromagnetic focussing lens 16, deflection plates 17 and 18 and a second electromagnetic focusing lens 19 and is subsequently incident on a sample 21 that is to be inspected. This sample is arranged on a slide or stage 23, which is movable in the x and y directions. If desired, electromagnetic deflection coils instead of the deflection plates 17 and 18, may be used, which coils may be arranged in such a way that they produce smaller aberrations than the deflection plates. Upon incidence of (primary) electrons of the electron beam on the sample secondary electrons are freed from the sample, material in dependence upon the structure of the sample, e.g. its surface structure or otherwise. The secondary electrons are captured by a detector 25, which converts the flux of incident secondary electrons in to a detector signal Sd, which comprises information about the structure of the sample. The signal Sd may be supplied to a cathode ray tube (CRT) 26 to make the sample structure visible to an operator. Alternatively, or simultaneously, the signal Sd may be supplied to a processing unit or personal computer 28. This computer is provided with a dedicated program or algorithm, which allows detracting relevant information from the signal Sd. This information may be outputted as a relevant information signal Si in the form of a data stream or a CRT signal for printing and visualizing, respectively, locally or remotely.

According to the invention, the SEM stage 23 is provided with a test sample, or test substrate, 30 having a porous surface as described hereinbefore, and the computer is provided with a dedicated test analyzing program to analyze the image taken by the SEM of the test sample. This sample may be small, for example 1×1 cm$^2$ and may comprise a porous surface with an average pore size continuously decreasing in one direction. By positioning the test sample in the object field of the scanning electron unit (12, 13, 14, 16, 17, 18, 19), scanning the sample in the direction of decreasing average pore size and analyzing the detector signal Sd thus obtained by the test analyzing program, a test signal St is obtained which comprises information about the performance (the resolution) of the SEM. In this way, a SEM is augmented with a self-testing capability by way of real by simple means.

The test signal may be supplied to a further processor 32 which forms one or more control signal for one or more actuator from the test signal. One or more components of the electron-scanning device can be set by the control signals such that the required SEM performance is obtained. In this way, the SEM is augmented with a self-control capability by means of which a good performance can be maintained throughout the life-time of the SEM. The signal Sc and the block 34 in FIG. 9 schematically represent said control signal or signals and the actuators. The SEM shown in FIG. 9 is a general purpose SEM, which may be used for various measurements and inspections.

Figure 11:
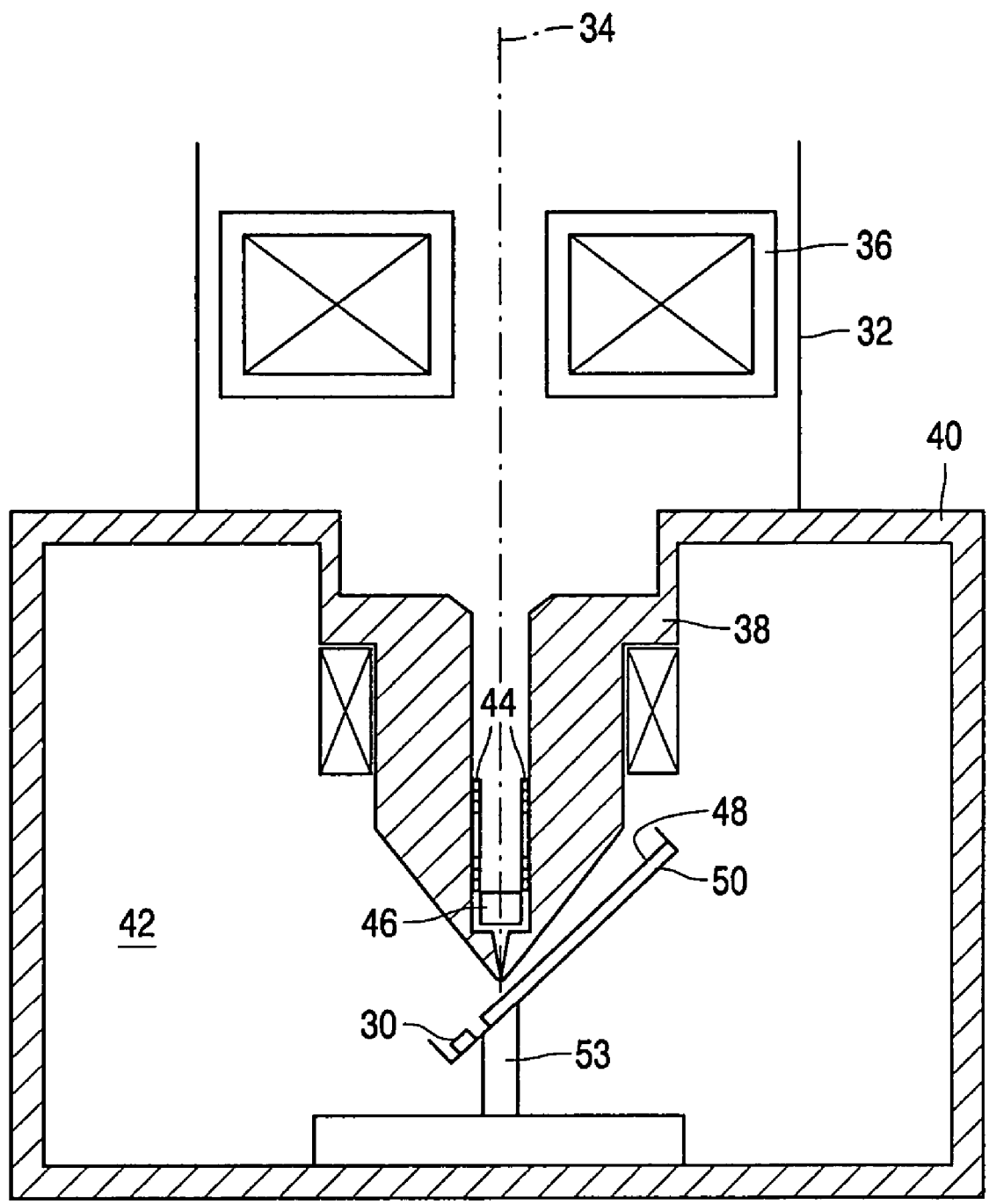
FIG. 11 shows a second embodiment of a SEM wherein the invention is implemented.

FIG. 11 shows schematically another embodiment of a SEM, which embodiment is especially suitable for controlling IC wafers with larger diameters, for example 30 cm. If a wafer with such a diameter were to be placed horizontally, the size of the vacuum chamber of the SEM would have to increase considerably. In order to limit the size of the SEM, the wafer is tilted with respect to the axis of the electron beam. In FIG. 11, reference numeral 32 denotes a part of the column of the SEM. An electron source (not shown in FIG. 11) produces an electron beam (the primary beam) that runs along the optical axis 34 of the SEM. This electron beam may pass one or more electromagnetic lenses, such as condensor lens 36 to finally reach an objective lens 38. This lens, in this embodiment a monopole lens, forms part of a magnetic circuit of which the wall 40 of the sample, or preparation, chamber 42 also forms part. Objective lens 38 brings the primary electron beam to a focus with which a sample, or object 48, to be examined and arranged under the objective lens is scanned. Scanning of the object 48 is effected by moving the primary electron beam across the object in two mutually orthogonal directions by means of scanning coils 44 accommodated in the bore of the objective lens 38. The object is mounted in an object carrier 50, which forms part of an object stage 53. The object carrier may be displaced in two mutually orthogonal directions so that a desired area of the object can be selected for examination. In addition thereto, the object carrier 50 may be tilted relative to the object stage 53.

Imaging is effected in that electrons from the primary beam incident on the object lose secondary electrons from the object, which secondary electrons propagate towards objective lens 38. These secondary electrons are detected by a detector 46 accommodated in the bore of this lens. This detector is connected to a processing unit (not shown) which energizes the detector to convert the force of detector electrons into an image signal that may be used for forming an image of the object, for example by means of a cathode ray tube.

According to the present invention, the object carrier 48 is provided with a test sample 30 and the processing unit is provided with a program to process the detector signals obtained when scanning the sample 30. This allows this SEM to be augmented with a self-testing and a self-control capability in the same way as described with reference to the SEM of FIG. 10.

A SEM which is regularly controlled by the method of the present invention may not only be used in a process of manufacturing ICs, but also in processes for manufacturing other devices like integrated and planar optical systems, liquid crystal display panels, thin-film magnetic heads, etc. Moreover, such a SEM, and thus the invention, can be used outside this manufacturing field for general measurement and inspection of fine structures and objects.

What is claimed is:

1. A method of determining the imaging quality of a scanning electron microscope used for measuring sizes of device features configured in a substrate layer during manufacture of devices, the method comprising the steps of:
   providing porous silicon surface areas;
   scanning the surface areas by means of the scanning electron microscope;
   analyzing the images taken by the scanning electron microscope by means of a Fast Fourier Transform technique to obtain an indication of the resolution of the scanning electron microscope, wherein the step of scanning the surface areas and the step of obtaining the resolution, respectively, comprise:
   taking images of a number of surface structures having different average pore sizes;
   calculating the Fourier spectrum of each of these images, and determining the resolution of the scanning electron microscope by extrapolating the resolution belonging to a signal to noise ratio of zero from the width, the signal amplitude and the noise offset of the Fourier spectrum of all of said images.

2. A method as recited in claim 1, wherein the step of taking images comprises scanning of porous silicon surface areas of a number of separate substrates, each of which has a different average pore size.

3. A method as recited in claim 1, wherein the step of taking images comprises scanning of a single substrate provided with a porous silicon surface having an average pore size which increases continuously in one direction from a small size to a larger size.

4. A method as recited in claim 3, wherein use is made of a substrate, the porous surface of which is provided with an additional pattern of features having dimensions which are substantially larger than the pore sizes.

* * * * *